United States Patent
Hobbs

[11] Patent Number: 5,986,492
[45] Date of Patent: Nov. 16, 1999

[54] DELAY ELEMENT FOR INTEGRATED CIRCUITS

[75] Inventor: James B. Hobbs, Plymouth, Minn.

[73] Assignee: Honeywell Inc., Minneapolis, Minn.

[21] Appl. No.: 08/829,746

[22] Filed: Mar. 31, 1997

Related U.S. Application Data

[63] Continuation of application No. 08/461,089, Jun. 5, 1995, abandoned.

[51] Int. Cl.[6] .................................................. H03K 19/094
[52] U.S. Cl. ............................ 327/284; 327/285; 327/288
[58] Field of Search ..................................... 327/261, 285, 327/288, 534–537, 284, 276–278, 281; 326/104, 112, 119–122; 331/57

[56] References Cited

U.S. PATENT DOCUMENTS

| | | |
|---|---|---|
| 4,124,820 | 11/1978 | Arnstein . |
| 4,330,750 | 5/1982 | Mayor . |
| 4,516,312 | 5/1985 | Tomita . |
| 4,645,958 | 2/1987 | Suzuki et al. . |
| 5,093,586 | 3/1992 | Asori ........................................ 327/536 |
| 5,111,085 | 5/1992 | Stewart . |
| 5,208,557 | 5/1993 | Kersh, III ................................. 331/57 |
| 5,302,871 | 4/1994 | Matsuzaki et al. ..................... 327/288 |

Primary Examiner—Timothy P. Callahan
Assistant Examiner—Eunja Shin
Attorney, Agent, or Firm—Gregory A. Bruns

[57] ABSTRACT

A delay element including a stack of p-channel transistors connected in series and a stack of n-channel transistors connected in series with the source of the top p-channel transistor connected to a positive voltage and the source of the bottom n-channel transistor connected to ground. The drain of each n-channel transistor is connected to the drain of a corresponding one of the p-channel transistors and all gates are interconnected and serve as the input to the delay element. The output of the delay element can be any one of the drain connections.

4 Claims, 1 Drawing Sheet

DELAY ELEMENT FOR INTEGRATED CIRCUITS

This application is a continuation of application Ser. No. 08/461,089, filed Jun. 5, 1995, now abandoned.

BACKGROUND OF THE INVENTION

The present invention relates to a delay element for integrated circuits (ICs).

ICs generally require delay circuits to compensate for differences in operating speeds of elements so that data does not arrive at a location before the desired time. In a full custom IC, delay circuits, using for example variations in gate length and gate width could be designed so that slower gates could provide the desired delay. Alternatively, in a full custom design, resistor and capacitor arrangements could be used to introduce delay.

In a gate array environment, one does not have available components such as resistors and capacitors for constructing RC delay circuits. In a gate array environment, generally only pairs of p-channel and n-channel transistors formed beforehand on a semiconductor substrate are available for interconnection.

One example of a need for a delay element is where a register file is created in a gate array and it may be desirable to have the register file written at some time other than a time corresponding to the edges of the normal clock. A delay element may then be used to skew the timing of when the register is written.

In the past, to obtain the necessary delay time in the gate array environment, the signal transmission times through the logic gates are conventionally used. However, the delay from the input time to the output time of logic gate is very small. Therefore, a great number of logic gates must be connected in series in order to obtain the desired delay time. Variations on this logic gate approach could include connecting a group of p-channel transistors in series and a group of n-channel transistors in series and treating each connected group as a single transistor for use in constructing logic gates. However with this arrangement there may be floating nodes depending on circuit activity and environmental conditions. While the unknown voltage of the floating nodes would not be objectionable in many applications, in a delay element application, the delay time provided by the circuit may be affected by the voltage of the nodes. In a delay application where it is important to always know what the delay will be, it is desirable to have the nodes fully charge or discharge each time the element is switched. In another variation, only the gates of a number of otherwise unused transistors can be connected to increase capacitance at a circuit input and thereby provide delay. In still another variation metal capacitance may be added to slow down the delay gates.

All of the previously described approaches to delay elements will have certain undesired characteristics.

Thus a need exists for an efficient delay element that accurately provides a predetermined delay.

SUMMARY OF THE INVENTION

The present invention solves these and other needs by providing a delay element including a stack of p-channel transistors connected in series and a stack of n-channel transistors connected in series. The source of the top p-channel transistor is connected to a positive voltage and the source of the bottom n-channel transistor is connected to ground. The drain of each n-channel transistor is connected to the drain of a corresponding one of the p-channel transistors. All gates are interconnected and serve as the input to the delay element. The output of the delay element can be any one of the drain connections.

DETAILED DESCRIPTION OF THE INVENTION

Figure 1:
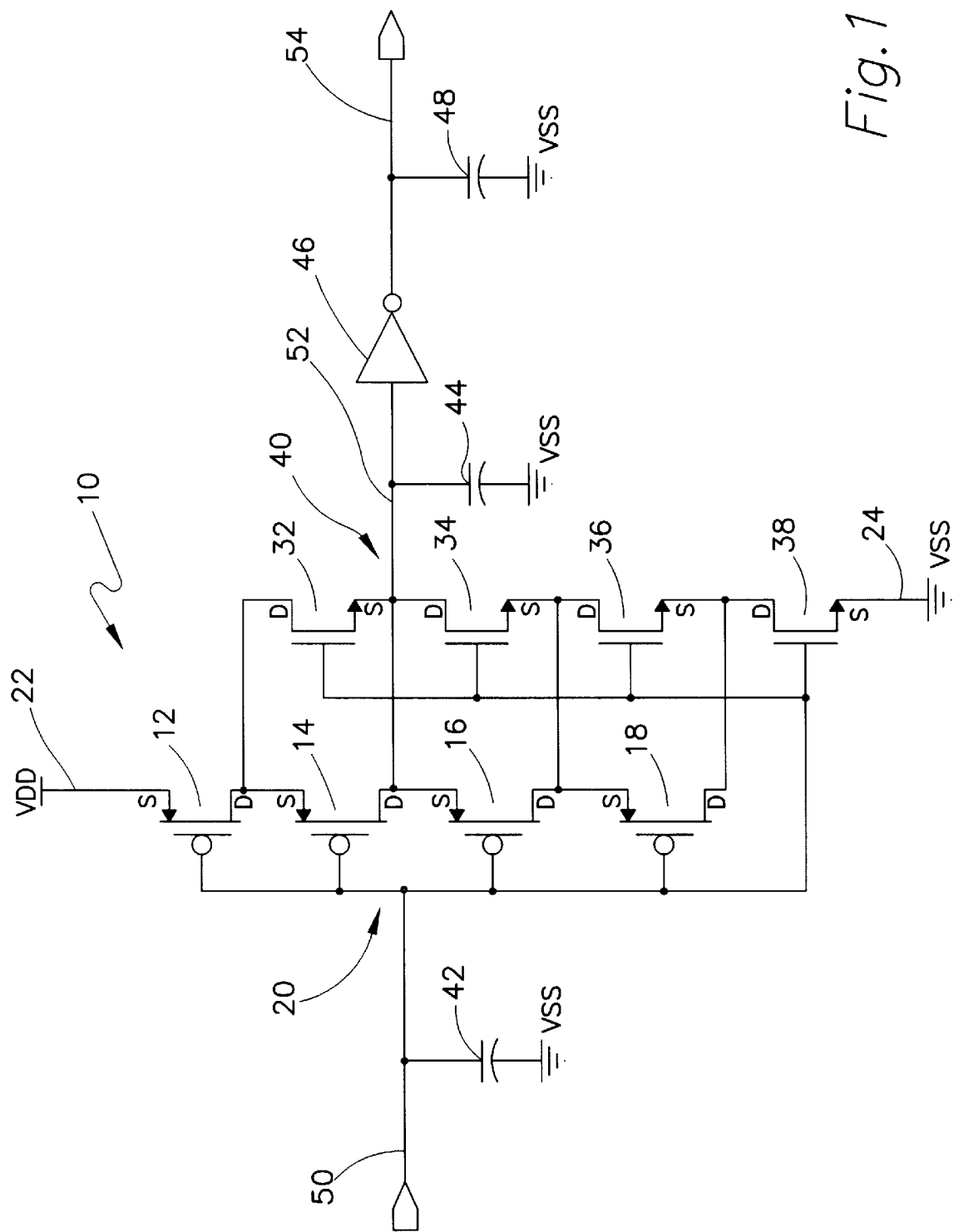
FIG. 1 is a schematic drawing according to the principles of the present invention.

A delay component or element is shown in the figures and generally designated 10. Delay element 10 includes p-channel transistors 12, 14, 16 and 18, arranged in a stack 20. Delay element 10 further includes n-channel transistors 32, 34, 36 and 38, arranged in a stack 40. P-channel transistor 12 has its source connected to positive voltage. Transistors 14, 16 and 18 each have a source connected to a drain of the immediately preceding p-channel transistor in stack 20. In stack 40, n-channel transistor 38 has its source connected to a voltage reference that is negative relative to the positive voltage at 22. Each of transistors 32, 34 and 36 have a drain connected to a source of the immediately preceding n-channel transistor. The gates of p-channel transistors in stack 20 and the gates of n-channel transistors of stack 40 are all connected in common and this common connection is input 50 of delay element 10. Output 52 of delay element 10 is shown at shorted drain connection of p-channel transistor 16 and n-channel transistor 34. However an output could be taken at the shorted drain connection of any p-channel transistor and its corresponding n-channel transistor. Delay element 10 is shown in an operating environment with capacitor 42 at input 50, and capacitor 44 shown at output 52. Also, a conventional inverter 46 and capacitor 48 are shown which would provide a non-inverted signal at output 54.

The present invention has been illustrated by showing a stack, 20, of 4 p-channel transistors interweaved with a stack 40 of 4 n-channel transistors. However it is understood that the principles of the invention would apply if the stack of p-channel transistors and the stack of n-channel transistors each included 2 or any greater number of transistors.

A SPICE simulation of the present invention for a gate array library was compared to the delay of a simple inverter of a standard gate array product.

For this simulation, a stack of 6 p-channel transistors and a stack of 6 n-channel transistors were interconnected according to the teaching of the present invention to form a single delay element. Six of the delay elements just described were then connected in series and the delay was determined to be approximately 9.9 nanoseconds (ns). By comparison, a simulation of 16 simple inverters provided a delay of approximately 0.94 ns.

In the present invention, stack 20 of p-channel transistors is completely interweaved with stack 40 of n-channel transistors. The stacking of the transistors decreases the drive capability of the gate and increases the input capacitance thereby increasing the delay. Interweaving the p-channel and n-channel stacks further increases the input capacitance by insuring full transitions on all drains. The assured full transitions increases the Miller effect multiplier for the input capacitance and insures that all drain capacitance must be charged or discharged. With the arrangement of the present invention, in either of two states, all nodes in the delay element 10 are held at Vdd or Vss. Therefore there are no nodes left floating as there would be with no interweaving of p-channel and n-channel transistors.

The scope of the invention is to be indicated by the appended claims, rather than by the foregoing description.

What is claimed is:

1. A delay element comprising:

a first p-channel transistor having a source, a drain and a gate, said source connected to a positive voltage;

a first n-channel transistor having a source, a drain, and a gate, said source connected to a reference voltage;

a plurality of ordered pairs of transistors with each said pair comprising a p-channel transistor, an n-channel transistor, a first connection between a source of said p-channel transistor and a drain of said n-channel transistor, and a second connection between a source of said n-channel transistor and a drain of said p-channel transistor;

said first connection of a first one of said ordered pairs connected to said drain of said p-channel transistor and said second connection of a last one of said ordered pairs connected to said drain of said first n-channel transistor;

an input means connected to a gate of said first p-channel transistor, a gate of said first n-channel transistor and gates of all pairs of transistors;

an output means connected from one of said first connections or one of said second connections wherein a delay time introduced by said delay element is related to the quantity of said ordered pairs.

2. The delay element of claim 1 wherein said output means is located at approximately a mid-point of said plurality of pairs.

3. The delay element of claim 1 wherein all nodes are maintained at said positive voltage or said reference voltage when said delay element is in a stable state.

4. A method of delaying an input signal comprising the following steps:

providing a first p-channel transistor having a source, a drain and a gate, said source connected to a positive voltage;

providing a first n-channel transistor having a source, a drain, and a gate; said source connected to a reference voltage;

providing a plurality of ordered pairs of transistors with each said pair comprising a p-channel transistor, an n-channel transistor, a first connection between a source of said p-channel transistor and a drain of said n-channel transistor, a second connection between a source of said n-channel transistor and a drain of said p-channel transistor, said first connection of a first one of said ordered pairs connected to said drain of said p-channel, transistor and said second connection of a last one of said ordered pairs connected to said drain of said first n-channel transistor;

applying said input signal at a gate of said first p-channel transistor, a gate of said first n-channel transistor and gates of all pairs of transistors;

utilizing an output signal from one of said first connections or one of said second connections wherein a delay time introduced by said delay element is related to the quantity of said ordered pairs.

* * * * *